US012408392B2

(12) United States Patent
Dou

(10) Patent No.: US 12,408,392 B2
(45) Date of Patent: Sep. 2, 2025

(54) SEMICONDUCTOR DEVICE AND METHOD OF FORMING THE SAME

(71) Applicant: ChangXin Memory Technologies, Inc., Hefei (CN)

(72) Inventor: Tao Dou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/908,467

(22) PCT Filed: Jul. 20, 2022

(86) PCT No.: PCT/CN2022/106659
§ 371 (c)(1),
(2) Date: Aug. 31, 2022

(87) PCT Pub. No.: WO2023/245788
PCT Pub. Date: Dec. 28, 2023

(65) Prior Publication Data
US 2024/0194731 A1 Jun. 13, 2024

(30) Foreign Application Priority Data

Jun. 21, 2022 (CN) .......................... 202210705481.0

(51) Int. Cl.
H10D 62/10 (2025.01)
H10B 12/00 (2023.01)
H10D 84/83 (2025.01)

(52) U.S. Cl.
CPC ........... *H10D 62/115* (2025.01); *H10B 12/01* (2023.02); *H10B 12/488* (2023.02); *H10D 84/83* (2025.01)

(58) Field of Classification Search
CPC ...... H10D 62/115; H10D 84/83; H10D 62/10; H10D 62/124; H10B 12/01; H10B 12/488; H10B 12/00
See application file for complete search history.

(56) References Cited

U.S. PATENT DOCUMENTS 8,936,972 B2 * 1/2015 Bangsaruntip ........ H01L 29/775
438/149
2014/0034908 A1 * 2/2014 Bangsaruntip ........ H01L 29/775
257/27

(Continued)

FOREIGN PATENT DOCUMENTS

CN 109616474 A 4/2019
CN 113644063 A 11/2021

(Continued)

OTHER PUBLICATIONS

PCT/CN2022/106659 International Search Report mailed Dec. 23, 2022.

*Primary Examiner* — Dao H Nguyen
(74) *Attorney, Agent, or Firm* — Kilpatrick Townsend & Stockton LLP

(57) ABSTRACT

The present disclosure relates to a semiconductor device and a method of forming the same. The semiconductor device includes: a substrate; a transistor on the substrate, which includes an active cylinder, the active cylinder includes a channel region, a source region and a drain distributed on opposite sides of the channel region, a first doped region located between the source region and the channel region, and a second doped region located between the drain region and the channel region, the first doped impurity region, the source region, the second doped impurity region and the drain region, all these regions include doped ions of the first type, and the doped concentration of the first impurity region is lower than that of the source region impurity concentra- (Continued)

tion, the doped concentration of the second doped region is lower than the doped concentration of the drain region. The present disclosure reduces the band-to-band tunneling effect inside the transistor, thereby reducing the GIDL effect.

19 Claims, 11 Drawing Sheets

(56) References Cited

U.S. PATENT DOCUMENTS

| | | | |
|---|---|---|---|
| 2018/0047832 A1* | 2/2018 | Tapily | H01L 29/66545 |
| 2020/0098756 A1* | 3/2020 | Lilak | H01L 21/823807 |
| 2021/0183862 A1 | 6/2021 | Son et al. | |
| 2021/0183863 A1 | 6/2021 | Hsu | |
| 2022/0367683 A1* | 11/2022 | Chen | H01L 27/088 |

FOREIGN PATENT DOCUMENTS

| | | |
|---|---|---|
| CN | 114369728 A | 4/2022 |
| CN | 114582801 A | 6/2022 |

\* cited by examiner

SEMICONDUCTOR DEVICE AND METHOD OF FORMING THE SAME

CROSS REFERENCES TO RELATED APPLICATIONS

This application claims the benefit of priority of Chinese patent application with the application number CN 202210705481.0, entitled "A Semiconductor Device and Method of Forming the Same", filed on Jun. 21, 2022, with the China National Intellectual Property Administration, the contents of which are incorporated herein by reference in its entirety.

TECHNICAL FIELD

The present disclosure relates to the technical field of semiconductor manufacturing, and in particular, to a semiconductor device and a method for forming the same.

BACKGROUND

A Dynamic Random Access Memory (DRAM) is a semiconductor device commonly used in electronic equipment such as computers, and includes a plurality of memory cells, each of which usually includes a transistor and a capacitor. The gate of the transistor is electrically connected to the word line, the source is electrically connected to the bit line, and the drain is electrically connected to the capacitor. The word line voltage on the word line can control the opening and closing of the transistor, so that the memory can read through the bit line to get data information in the capacitor, or write the data information into the capacitor.

A transistor of a semiconductor device such as the DRAM generally further includes a channel region, a source regions and a drain region located on opposite sides of the channel region and adjacent to the channel region. As the size of DRAMs continues to shrink, the BTBT (Band to Band Tunneling) effect inside the transistor is enhanced, resulting in an enhanced GIDL (Gate-Induced Drain Leakage) effect inside the semiconductor device. This eventually leads to the degradation of the electrical properties of the semiconductor device.

Therefore, how to reduce the GIDL effect inside the semiconductor device and improve the performance of the semiconductor device is an urgent technical problem to solved at the present time.

SUMMARY

Some embodiments of the present disclosure provide a semiconductor device and a method for forming the same, which are used to reduce the GIDL effect inside the semiconductor device, thereby improving the electrical performance of the semiconductor device and improving the yield of the semiconductor device.

According to some embodiments, the present disclosure provides a semiconductor device comprising:
 a substrate; and
 a transistor located on the substrate and including an active cylinder, the active cylinder includes a channel region, a source region and a drain region distributed on opposite sides of the channel region, a first doped region between the source region and the channel regions, and a second doped region between the drain region and the channel region; the first doped region, the source region, the second doped region and the drain region contain doping ions of the first type; the doped concentration of the first doped region is lower than the doped concentration of the source region, and the doped concentration of the second doped region is less than the doped concentration of the drain region.

In some embodiments, the active cylinders extends along a first direction, the first direction being a direction parallel to the top surface of the substrate. The semiconductor device further includes:
 a first isolation layer, located on the substrate, wherein the first isolation layer is distributed around the periphery of the first doped region, and the active cylinder penetrates the first isolation layer along the first direction; and
 a second isolation layer, located on the substrate, wherein the second isolation layer is distributed around the outer periphery of the second doped region, and the active cylinder penetrates the second isolation layer along the first direction.

In some embodiments, a plurality of the active cylinders are arranged at intervals along a second direction, the second direction is a direction parallel to the top surface of the substrate, and the first direction and the second direction intersect;
 The first isolation layer continuously surrounds the outer periphery of the plurality of first doped regions arranged at intervals along the second direction; and
 the second isolation layer continuously surrounds the outer periphery of the plurality of second doped regions arranged at intervals along the second direction.

In some embodiments, it also includes:
 a first air gap, located between the adjacent first doped regions; and
 a second air gap, located between the adjacent second doped regions.

In some embodiments, the active cylinders extend along a first direction, the first direction being a direction parallel to the top surface of the substrate. The semiconductor device further includes:
 a first isolation layer located on the substrate, and the first isolation layer covers the first doped region, the active cylinder penetrates the first isolation layer along the first direction; and
 a second isolation layer, located on the substrate, and the second isolation layer covers the second doped region, and the active cylinder penetrates the second isolation layer along the first direction.

In some embodiments, a plurality of the active cylinders are arranged at intervals along a second direction, the second direction is a direction parallel to the top surface of the substrate, and the first direction and the second direction intersect;
 the first isolation layer continuously covers a plurality of the first doped regions spaced along the second direction; and
 The second isolation layer continuously covers the plurality of the second doped regions spaced along the second direction.

In some embodiments, the channel region includes dopant ions of the first type; or,
 The channel region includes dopant ions of a second type, and the dopant ions of the first type and the dopant ions of the second type are of opposite conductivity.

In some embodiments, the active cylinders extend in a first direction, the first direction being a direction parallel to a top surface of the substrate.

The length of the first doped region along the first direction is more than twice the thickness of the active cylinder along a third direction, and the third direction is a direction perpendicular to the top surface of the substrate.

The length of the second doped region along the first direction is more than twice the thickness of the active cylinder along the third direction.

In some embodiments, the active cylinders extend in a first direction, the first direction being a direction parallel to a top surface of the substrate;

The length of the first doped region along the first direction is greater than or equal to the length of the source region along the first direction.

The length of the second doped region along the first direction is greater than or equal to the length of the drain region along the first direction.

In some embodiments, the active cylinders extend along a first direction, and a plurality of the active cylinders are arranged in arrays along the second direction and the third direction, both of the first direction and the second direction are parallel to the top surface of the substrate, and the first direction intersects the second direction, and the third direction is a direction perpendicular to the top surface of the substrate. The semiconductor device further includes:
  word lines extending along the second direction and continuously covering the channel regions in a plurality of the active cylinders spaced along the second direction; and
  a plurality of the word lines arranged at intervals along the third direction, and among the two adjacent word lines along the third direction, one of the word lines closer to the substrate protrudes from another word lines along the second direction.

According to other embodiments, the present disclosure also provides a method for forming a semiconductor device, comprising the following steps:
  provide a substrate;
  forming a transistor on the substrate, the transistor includes an active cylinder, the active cylinder includes a channel region, a source region and a drain region distributed on opposite sides of the channel region, and the source region; a first doped region disposed between the source region and the channel region, and a second doped region between disposed between the drain region and the channel region; the first doped region, the source region, the second doped region and the drain region all include doping ions of the first type; and the doped concentration of the first doped region is lower than the doped concentration of the source region, and the doped concentration of the second doped region is lower than the doped concentration of the drain region.

In some embodiments, the specific steps of forming transistors on the substrate include:
  forming semiconductor cylinders over the substrate;
  defining an initial channel region in the semiconductor cylinder, initial source regions and initial drain regions distributed on opposite sides of the initial channel region, and between the initial source region and the initial channel region an initial first doped region, and an initial second doped region between the initial drain region and the initial channel region; and
  implanting a first type doping ions into the initial source region, the initial drain region, the initial first doped region and the initial second doped region to form the source region, the first doped region a doped region, the drain region and the second doped region.

In some embodiments, an initial channel region, an initial source region and an initial drain region distributed on opposite sides of the initial channel region, and the initial source region and the initial drain region are defined in the semiconductor cylinder. The specific steps of the initial first doped region between the initial channel regions and the initial second doped region between the initial drain region and the initial channel region include:
  defining an initial channel region in the semiconductor cylinder, an initial source region and an initial drain region distributed on opposite sides of the initial channel region along a first direction, and an initial source region along the first direction, an initial first doped region between the initial channel region and the initial channel region, and an initial second doped region located between the initial drain region and the initial channel region along the first direction, so the length of the initial first doped region along the first direction is more than twice the thickness of the semiconductor cylinder along the third direction; and the length of the initial second doped region along the first direction is more than twice the thickness of the semiconductor cylinder along third direction, wherein the first direction is a direction parallel to the top surface of the substrate, and the third direction is a direction perpendicular to the top surface of the substrate.

In some embodiments, the specific steps of forming semiconductor cylinders over the substrate include:
  forming a stacked layer on the substrate, the stacked layer including a semiconductor layer and a sacrificial layer alternately stacked along a third direction, the third direction being a direction perpendicular to the top surface of the substrate;
  etching the stacked layer to form a first trench penetrating the stacked layer along the third direction, a plurality of the first trenches are arranged at intervals along the second direction, and the first trench connects the semiconductor layer is separated into a plurality of the semiconductor cylinders spaced along the second direction, the semiconductor cylinders extend along the first direction, and both the first direction and the second direction are parallel to the top surface of the substrate, and the first direction intersects the second direction.

In some embodiments, before implanting the first type dopant ions into the initial source region, the initial drain region, the initial first doped region and the initial second doped region, the method further includes the following step:
  removing a part of the sacrificial layer from the stacked layer to form second trenches and third trenches, the second trenches expose the semiconductor cylinders between the initial first doped region and the initial channel region and the semiconductor cylinders between the initial first doped region and the initial source region, the third trenches expose the semiconductor cylinder between the initial second doped region and the initial channel region and the semiconductor cylinder between the initial second doped region and the initial drain region;
  depositing a first dielectric material in the second trenches and the third trenches, forming a first isolation layer in the second trenches, and forming a second isolation layer in the third trenches at the same time.

In some embodiments, before implanting the first type dopant ions into the initial source region, the initial drain region, the initial first doped region and the initial second doped region, the method further includes the following steps:

removing the sacrificial layer in the stacked layer to expose the fourth trenches of the semiconductor cylinder; and filling the fourth trenches with a second dielectric material to form an interlayer isolation layer.

In some embodiments, the specific steps of implanting the first type dopant ions into the initial source region, the initial drain region, the initial first doped region and the initial second doped region include:

implanting first type dopant ions into the initial source region and the initial drain region to form the source region and the drain region; and implanting the first type of doping ions into the initial first doped region and the initial second doped region to form the first doped region and the second doped region.

In some embodiments, it also includes:

Implanting the first type dopant ions into the initial channel region to form the channel region; or, implanting the second type of dopant ions into the initial channel region to form the channel region, wherein the first type of dopant ions and the second type of dopant ions have opposite conductivity types.

In some embodiments, after forming the source region, the first doped region, the drain region and the second doped region, it further includes the following steps:

removing the interlayer isolation layer from between the adjacent first doped regions and simultaneously removing the interlayer isolation layer from between the adjacent second doped regions to form adjacent first doped regions, wherein a first air gap is formed between the adjacent first doped regions, and a second air gap is formed between the adjacent second doped regions simultaneously.

In some embodiments, after forming the first air gap between the adjacent first doped regions and simultaneously forming the second air gap between the adjacent second doped regions, the method further comprises the following step:

depositing the first dielectric material in the first air gap and the second air gap.

Some embodiments of the present disclosure provide a semiconductor device and a method for forming the same, by arranging a first doped region between a channel region and a source region, and arranging a second doped region between the channel region and the drain region, and the ion doping type of the first doped region is the same as that of the source region, the ion doping type of the second doped region is the same as that of the drain region, and the doped concentration of the first doped region is lower than that of the source region and the second doped region. The doped concentration of the impurity region is lower than that of the drain region, so as to reduce the band to band tunneling effect inside the transistor, thereby reducing the GIDL effect. Furthermore, some embodiments of the present disclosure form a first isolation layer surrounding the first doped region and a second isolation layer surrounding the second doped region. On the one hand, the first doped region and the second doped region affect other components in the semiconductor device; on the other hand, it also helps to further reduce the band-band tunneling effect inside the transistor, thereby further reducing the GIDL effect.

DETAILED DESCRIPTION OF THE PREFERRED EMBODIMENTS

The specific embodiments of the semiconductor device and the method thereof provided by the present disclosure will be described in detail below with reference to the accompanying drawings.

Figure 1:
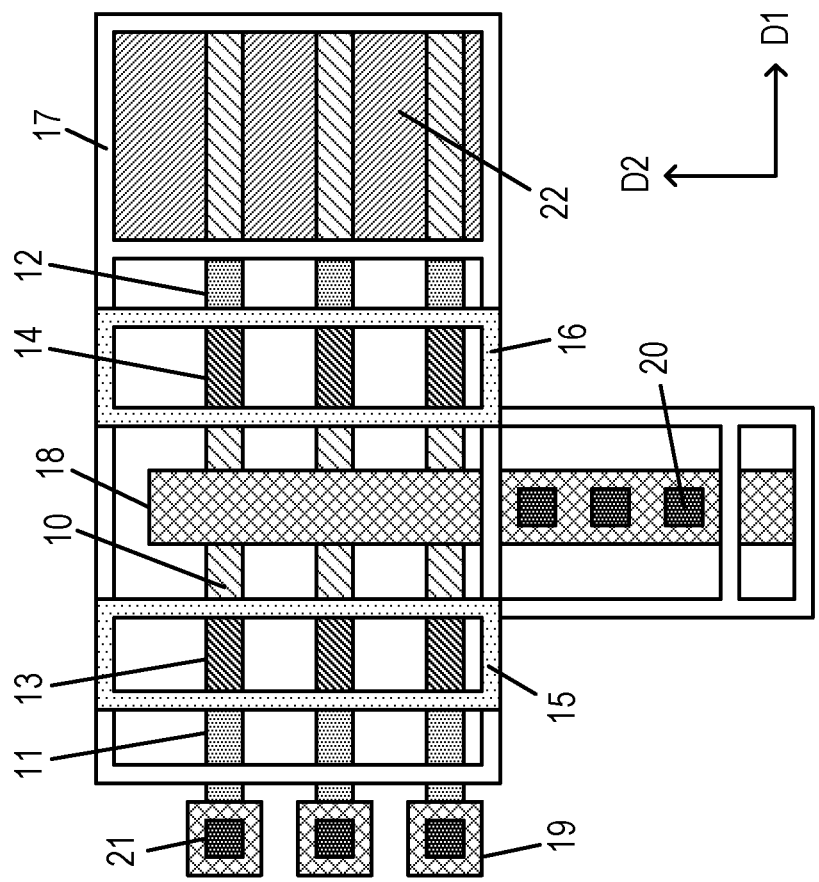
FIG. 1 is a schematic top-view diagram of a semiconductor device structure in an embodiment of the present disclosure.

This embodiment is provided by FIG. 1, is a schematic top-view diagram of the semiconductor device structure in an embodiment of the present disclosure. As shown in FIG. 1, the semiconductor device includes:

a substrate;

the transistor is located on the substrate, and includes an active cylinder, the active cylinder includes a channel region 10, a source region 11 and a drain region 12 disposed on opposite sides of the channel region 10, located on the first doped region 13 between the source region 11 and the channel region 10, and a second doped region 14 between the drain region 12 and the channel region 10. The first doped region 13, the source region 11, the second doped region 14 and the drain region 12 all include doping ions of the first type, and the doped concentration of the first doped region 13 is less than the doped concentration of the source region 11, and the doped concentration of the second doped region 14 is lower than the doped concentration of the drain region 12.

Specifically, the substrate may be, but not limited to, a silicon substrate, and this specific embodiment is described by taking the substrate being a silicon substrate as an example. In other embodiments, the substrate may also be a semiconductor substrate such as gallium nitride, gallium arsenide, gallium carbide, silicon carbide, or SOI. The substrate is used to support device structures thereon. The semiconductor device may be, but is not limited to, a DRAM, and this specific embodiment is described by taking the semiconductor device being a DRAM as an example, where the substrate includes a memory array having a plurality of memory cells arranged in an array, the memory cells include transistors, and capacitors 22 electrically connected to the transistors. The active cylinder in the transistor includes the channel region 10, the source region 11, the drain region 12, the first doped region 13 and the second doped region 14, wherein, the channel region 10 and the source region 11 are distributed on opposite sides of the first doped region 13 along the extending direction of the active cylinder, and the channel region 10 and the drain region The regions 12 are distributed on opposite sides of the second doped region 14 along the extending direction of the active cylinders. The semiconductor device further includes support pillars 17 distributed around the periphery of the memory array and penetrating the memory array in a direction perpendicular to the top surface of the substrate. The support column 17 is used to support the storage array and to isolate the storage array from other peripheral components. In one embodiment, the material of the support pillar 17 may be a nitride material (e.g., silicon nitride). A plurality of in the present embodiment refers to two or more.

The types of doping ions in the first doped region 13, the source region 11, the second doped region 14 and the drain region 12 are of the same type (all are the first type doping ions)), that is, the first doped region 13, the source region 11, the second doped region 14 and the drain region 12 are doped with the same type of ions. The doped concentration of the first type dopant ions in the first doped region 13 is lower than the doped concentration of the first type doping ions in the source region 11, and the second doped region 14. The doped concentration of the first type dopant ions in the drain region 12 is smaller than the doped concentration of the first type dopant ions in the drain region 12, that is, the first doped region 13 and the second doping ion region 14 is lightly doped, and the source region 11 and the drain region 12 are heavily doped. By arranging the first doped region 13 lightly doped with the same type as the source region 11, between the source region 11 and the channel region 10, and arranging the second doped region 14 lightly doped with the same type as the drain region 12, between the drain region 12 the channel regions 10, the band to band tunneling effect inside the transistor will be reduced, thereby reducing the GIDL effect.

In some embodiments, the active cylinders extend along a first direction D1, the first direction D1 being a direction parallel to the top surface of the substrate. The semiconductor device further includes:
  the first isolation layer 1, located on the substrate, and the first isolation layer 15 is distributed around the outer circumference of the first doped region 13, and the active cylinder penetrates the first direction D1 along the first direction D1, an isolation layer 15; and
  the second isolation layer 16, located on the substrate, and the second isolation layer ring 16 is disposed around the outer periphery of the second doped region 14, and the active cylinder penetrates through the second isolation layer 16 in the first direction D1.

In some embodiments, a plurality of the active cylinders are arranged at intervals along a second direction D2, the second direction D2 is a direction parallel to the top surface of the substrate, and the first direction D1 and the second direction D2 intersect.

The first isolation layer 15 continuously surrounds the outer periphery of the plurality of first doped regions 13 arranged at intervals along the second direction D2.

The second isolation layer 16 continuously surrounds the outer periphery of the plurality of second doped regions 14 arranged at intervals along the second direction D2.

In some embodiments, it also includes:
  a first air gap, located between the adjacent first doped regions 13;
  a second air gap, located between the adjacent second doped regions 14.

Specifically, as shown in FIG. 1, the active cylinders extend along the first direction D1, and a plurality of the active cylinders extend along the second direction D2 and perpendicular to the top surface of the substrate. The directions are arranged in an array. The top surface of the substrate refers to the surface of the substrate facing the active cylinder. Correspondingly, the plurality of first doped regions 13 are arranged in an array along the second direction D2 and the direction perpendicular to the top surface of the substrate, and the plurality of second doped regions 14 are also arranged along the second direction D2, which is the direction perpendicular to the top surface of the substrate are arranged in an array. The first isolation layer 15 is in the shape of a surrounding frame, extends in a direction perpendicular to the top surface of the substrate, and is continuously distributed around the periphery of the plurality of first doped regions 13 arranged in an array. The second isolation layer 16 is also in the shape of a surrounding frame, extends in a direction perpendicular to the top surface of the substrate, and is continuously distributed around the periphery of the plurality of second doped regions 14 arranged in an array. The first doped region 13 is isolated from signal lines such as word lines in the semiconductor device by the first isolation layer 15, and the second doped region 14 is isolated from the second doped region 14 by the second isolation layer 16 signal lines such as word lines in the semiconductor device, thereby helping to further reduce the GIDL effect. In one embodiment, the materials of the first isolation layer 15 and the second isolation layer 16 are the same, for example, both are insulating dielectric materials such as nitride (e.g., silicon nitride). The first air gap is formed between the first doped regions 13 surrounded by the first isolation layer 15, so that the low dielectric constant of air is used to reduce the gap between the adjacent first doped regions 13 interference. Correspondingly, the second air gap is formed between the second doped regions 14 surrounded by the second isolation layer 16, so that the low dielectric constant of air is used to reduce the adjacent second doped regions 14 interference between.

In one embodiment, the first isolation layer 15 and the second isolation layer 16 can be formed simultaneously with the support pillars 17, thereby simplifying the manufacturing process of the semiconductor device and reducing the manufacturing cost of the semiconductor device.

In other embodiments, the active cylinders extend along a first direction D1, and the first direction D1 is a direction parallel to the top surface of the substrate; the semiconductor device further includes:
  The first isolation layer 15 is located on the substrate, and the first isolation layer 15 covers the first doped region 13, and the active cylinder penetrates the first isolation along the first direction D1 layer 15;
  The second isolation layer 16 is located on the substrate, and the second isolation layer 16 covers the second doped region 14, and the active cylinder penetrates the second isolation layer 16 along the first direction D1

In other embodiments, a plurality of the active cylinders are arranged at intervals along a second direction D2, the second direction D2 is a direction parallel to the top surface of the substrate, and the first direction D1 and the second direction D2 intersect.

The first isolation layer 15 continuously covers a plurality of the first doped regions 13 spaced along the second direction D2.

The second isolation layer 16 continuously covers the plurality of the second doped regions 14 arranged at intervals along the second direction D2.

Figure 2:
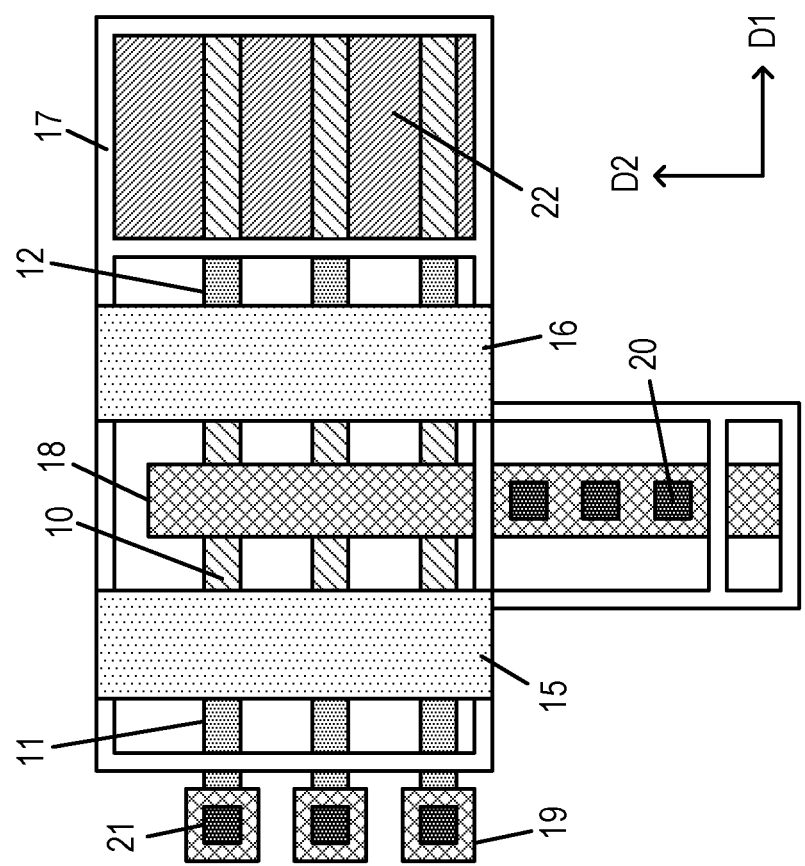
FIG. 2 is a schematic top-view diagram of a semiconductor device structure in another embodiment of the present disclosure.

Specifically, as shown in FIG. 2, the active cylinders extend along the first direction D1, and a plurality of the active cylinders extend along the second direction D2 and perpendicular to the top surface of the substrate. The directions are arranged in an array. The top surface of the substrate refers to the surface of the substrate facing the active cylinder. Correspondingly, the plurality of first doped regions 13 are arranged in an array along the second direction D2 and the direction perpendicular to the top surface of the substrate, and the plurality of second doped regions 14 are also arranged along the second direction D2 and the direction perpendicular to the top surface of the substrate are arranged in an array. The first isolation layer 15 continuously covers a plurality of the first doped regions 13 arranged in an array, and fills the gaps between the adjacent first doped regions 13. The second isolation layer 16 continuously covers the plurality of second doped regions 14 arranged in an array, and fills the gaps between adjacent second doped regions 14, thereby further reducing the band-to-band tunneling effect.

In order to meet the requirements of various applications of the semiconductor device, in some embodiments, the channel region 10 includes the first type dopant ions; or, The channel region 10 includes dopant ions of a second type, and the dopant ions of the first type are of opposite conductivity types to the dopant ions of the second type.

For example, the channel region 10, the first doped region 13 and the second doped region 14 are all lightly doped with N-type ions, the source region 11 and the drain region 12 Both are heavily doped with N-type ions. Alternatively, the channel region 10, the first doped region 13 and the second doped region 14 are all lightly doped with P-type ions, and the source region 11 and the drain region 12 are all lightly doped with P-type ions. P-type ions are heavily doped. Alternatively, the channel region 10 is lightly doped with N-type ions, the first doped region 13 and the second doped region 14 are both lightly doped with P-type ions, the source region 11 and all The drain region 12 is heavily doped with P-type ions. Alternatively, the channel region 10 is lightly doped with P-type ions, the first doped region 13 and the second doped region 14 are both lightly doped with N-type ions, and the source region 11 and all the drain region 12 are heavily doped with N-type ions.

In some embodiments, the active cylinders extend along a first direction D1, the first direction D1 being a direction parallel to the top surface of the substrate.

The length of the first doped region 13 along the first direction D1 is more than twice the thickness of the active cylinder along the third direction, and the third direction is perpendicular to the top surface of the substrate. direction.

The length of the second doped region 14 along the first direction D1 is more than twice the thickness of the active cylinder along the third direction.

For example, the thickness of the active cylinder along the third direction (i.e., the diameter of the active cylinder) may be greater than or equal to 5 nm, the first doped region 13 and the second doped region 14 The length along the first direction D1 may be greater than or equal to 10 nm. In this specific embodiment, the lengths of the first doped regions 13 and the second doped regions 14 along the first direction D1 are both set to be more than twice the thickness of the active cylinders along the third direction, which can better reduce or even eliminate the band-band tunneling effect, thereby reducing and setting the GIDL effect completely.

In some embodiments, the active cylinders extend along a first direction D1, the first direction D1 being a direction parallel to the top surface of the substrate.

The length of the first doped region 13 along the first direction D1 is greater than or equal to the length of the source region 11 along the first direction D1.

The length of the second doped region 14 along the first direction D1 is greater than or equal to the length of the drain region 12 along the first direction D1.

Specifically, the longer length of the first doped region 13 and the length of the second doped region 14 are, the more significant the effect of reducing GIDL is. In order not to increase the size of the semiconductor device, along the first direction D1, the length of the first doped region 13 may be greater than the length of the source region 11, and the length of the second doped region 14 is greater than the length of the drain region 12.

In some embodiments, the active cylinders extend along a first direction D1, a plurality of the active cylinders are arranged in an array along a second direction D2 and a third direction, the first direction D1 and the second direction D2 are all directions parallel to the top surface of the substrate, and the first direction D1 and the second direction D2 intersect, and the third direction is a direction perpendicular to the top surface of the substrate. The semiconductor device further includes:

word lines 18, extending along the second direction D2, and continuously covering the channel regions 10 in the plurality of the active cylinders spaced along the second direction D2; and multiple word lines 18 are arranged at intervals along the third direction, and among the two adjacent word lines 18 along the third direction, the one word line 18 closer to the substrate protrudes above the other word line 18 along the second direction D2.

Specifically, as shown in FIGS. 1 and 2, the capacitor 22 is electrically connected to the drain region 12 in the transistor. The semiconductor device further includes bit lines 19 extending along the third direction, each of the bit lines 19 is in electrical contact with a plurality of the source regions 11 arranged at intervals along the third direction, and a plurality of the bit lines 19 are electrically connected to each other. The bit lines 19 are arranged at intervals along the second direction D2. The top surface of the bit line 19 is further provided with a bit line plug 21 for electrically connecting the bit line 19 and a peripheral control circuit. The semiconductor device further includes a plurality of the word lines 18 extending along the second direction D2, the plurality of the word lines 18 are spaced along the third direction, and each of the word lines 18 continuously covers a plurality of the channel regions 10 arranged at intervals alternatively along the second direction D2 are covered. The ends of the word lines 18 extend out of the memory array, and the ends of a plurality of the word lines 18 extend out of the memory array to form a stepped structure, so that the word line plugs 20 are used to electrically connect the memory arrays. Word lines 18 and peripheral control circuits. The step-like structure refers to that, among the two adjacent word lines 18 along the third direction, one word line 18 closer to the substrate protrudes from the other along the second direction D2 the word lines 18.

Figure 3:
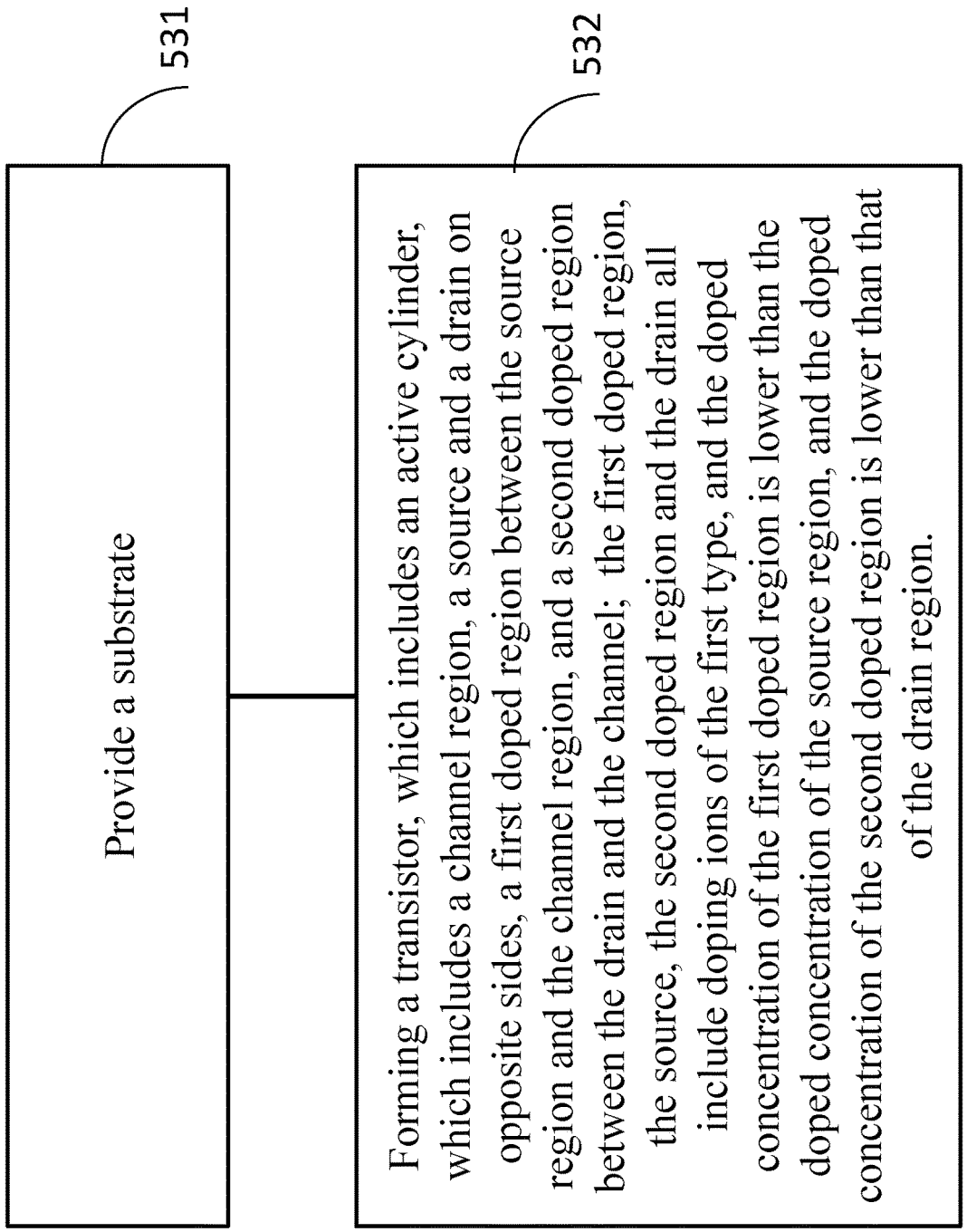
FIG. 3 shows a method of forming a semiconductor device according to an embodiment of the present disclosure.

This specific embodiment also provides a method for forming a semiconductor device in FIG. 3, according to an embodiment of the present disclosure; and FIGS. 4-11 are schematic diagrams at major steps in the main process of forming a semiconductor device according to an embodiment of the present disclosure.

Figure 4:
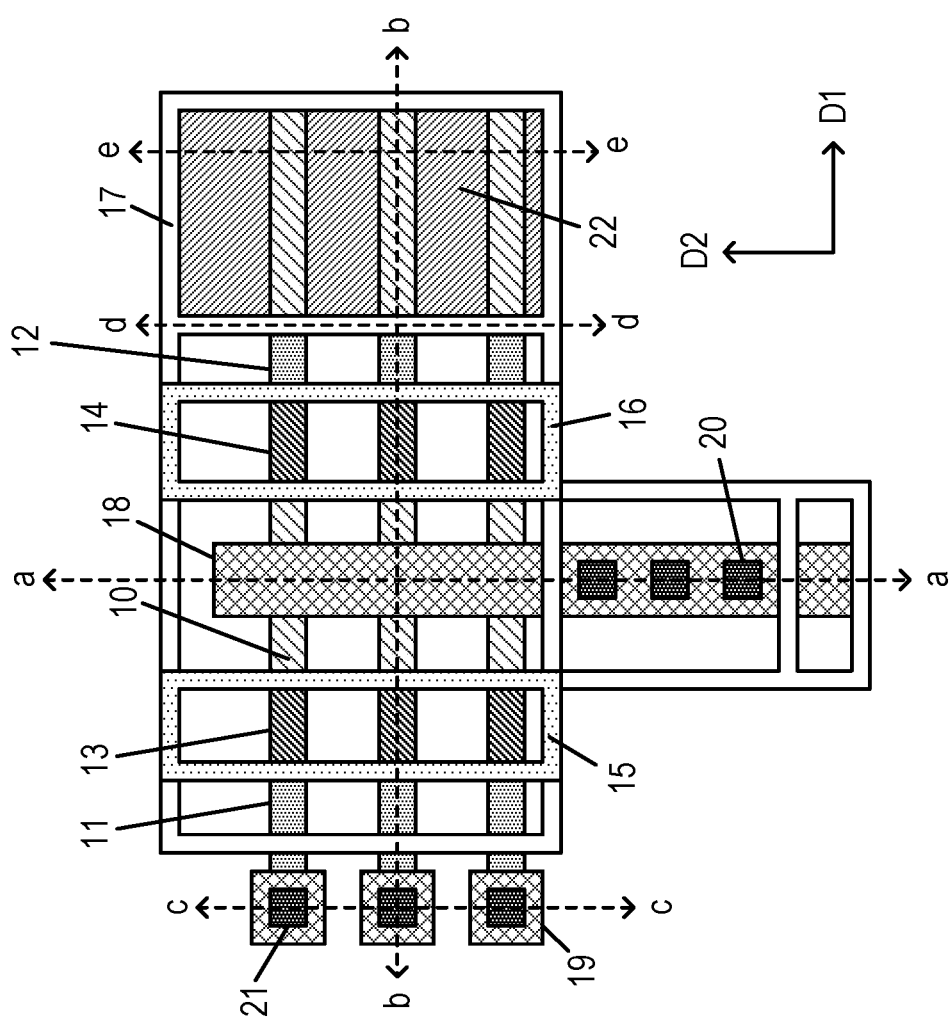
FIGS. 4-11 are schematic diagrams at major steps in the main process of forming a semiconductor device according to an embodiment of the present disclosure.
Figure 5:
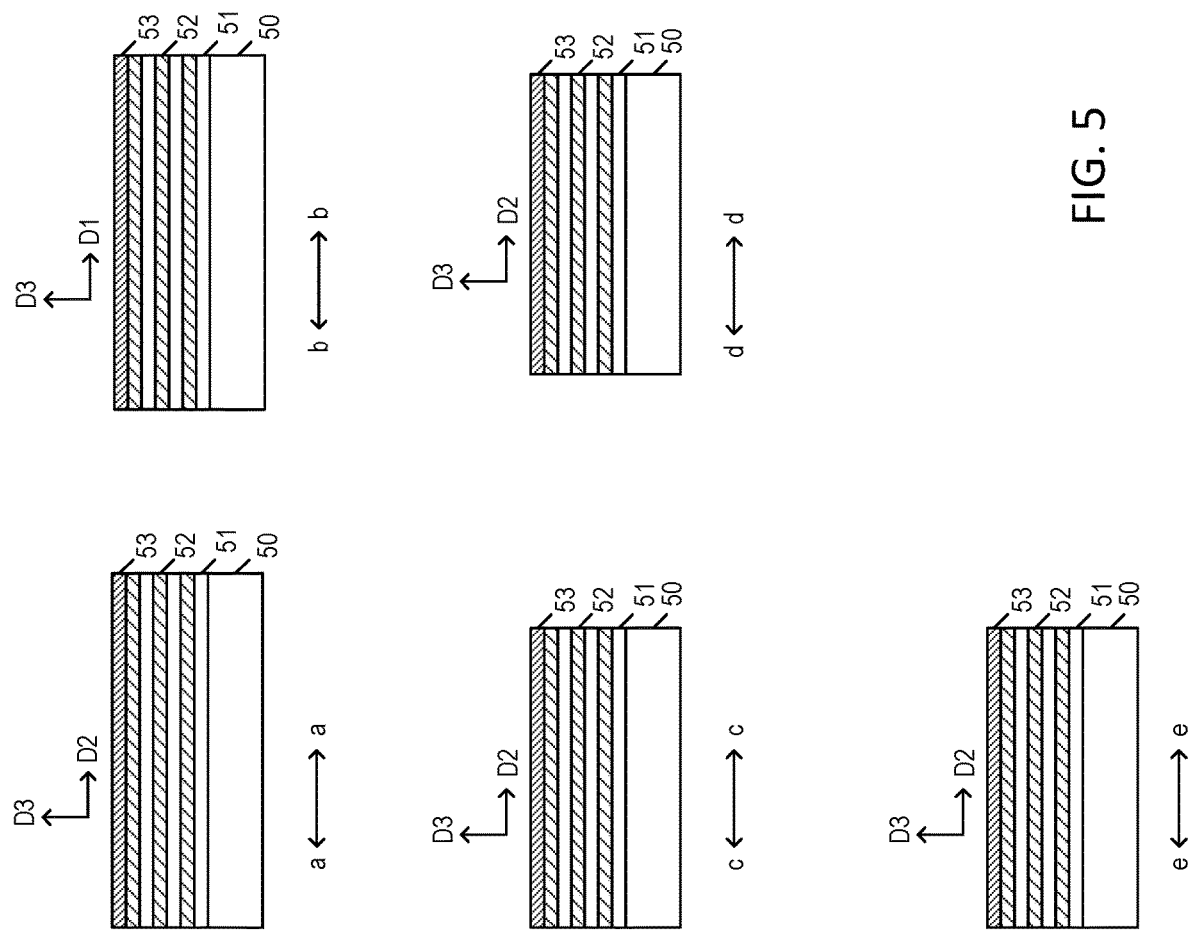

FIG. 4 is a schematic top view structure of the semiconductor device formed by this specific embodiment, and FIGS. 5-11 are the a-a position and the b-b position in FIG. 4 during the formation process of the semiconductor device, c-c position, d-d position and e-e position of the main process cross-sectional schematic diagram, to clearly show the formation process of the semiconductor device. The structure of the semiconductor device formed by this specific embodiment can be referred to FIG. 1 and FIG. 2. The semiconductor device formed by this embodiment may be, but is not limited to, a DRAM. As shown in FIGS. 5-11, the method for forming the semiconductor device includes the following steps:

In step S531, a substrate 50 is provided, as shown in FIG. 5.

Specifically, the substrate 50 may be, but is not limited to, a silicon substrate, and this specific embodiment is described by taking the substrate 50 as a silicon substrate as an example. In other embodiments, the substrate 50 may also be a semiconductor substrate such as gallium nitride, gallium arsenide, gallium carbide, silicon carbide, or SOI. The substrate 50 is used to support device structures thereon.

Figure 11:
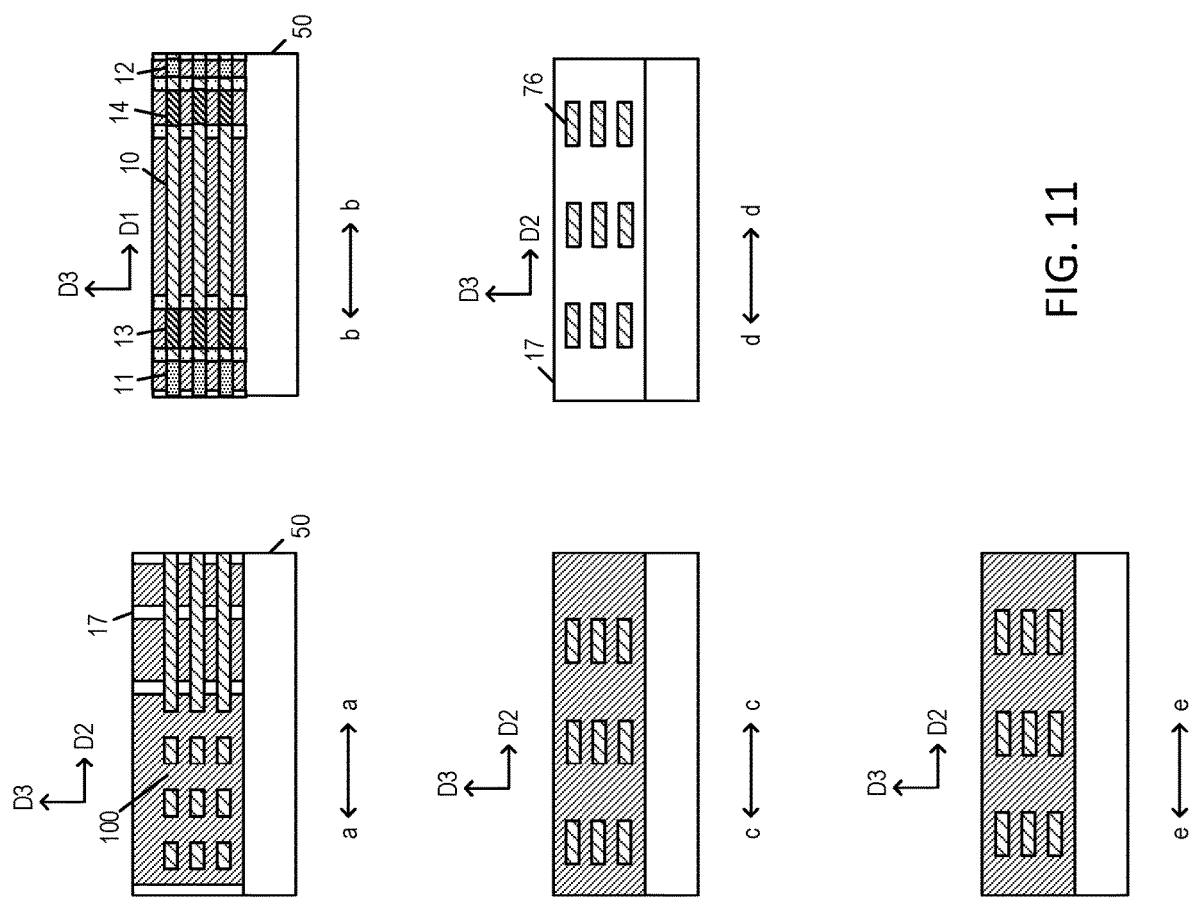

Step S532, forming a transistor on the substrate, the transistor includes an active cylinder, and the active cylinder includes a channel region 10, a source region 11 and a drain distributed on opposite sides of the channel region 10 and region 12, a first doped region 13 between the source region 11 and the channel region 10, and a second doped region between the drain region 12 and the channel region 10. The first doped region 13, the source region 11, the second doped region 14 and the drain region 12 all include doping ions of the first type, and the doped concentration of the first doped region 13 is lower than the doped concentration of the source region 11, and the doped concentration of the second doped region 14 is lower than that of the drain region 12, as shown in FIG. 11 and FIG. 4.

Figure 6:
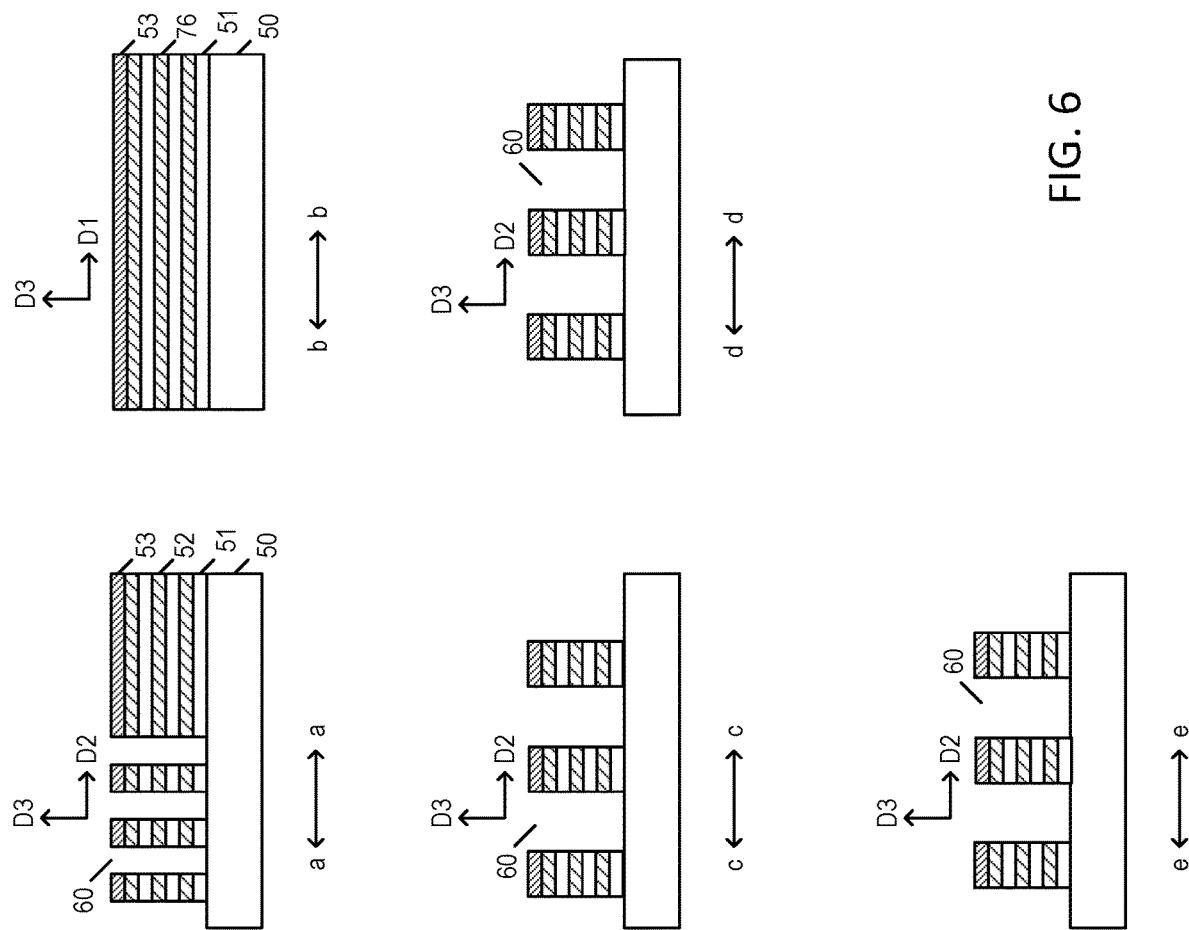
Figure 9:
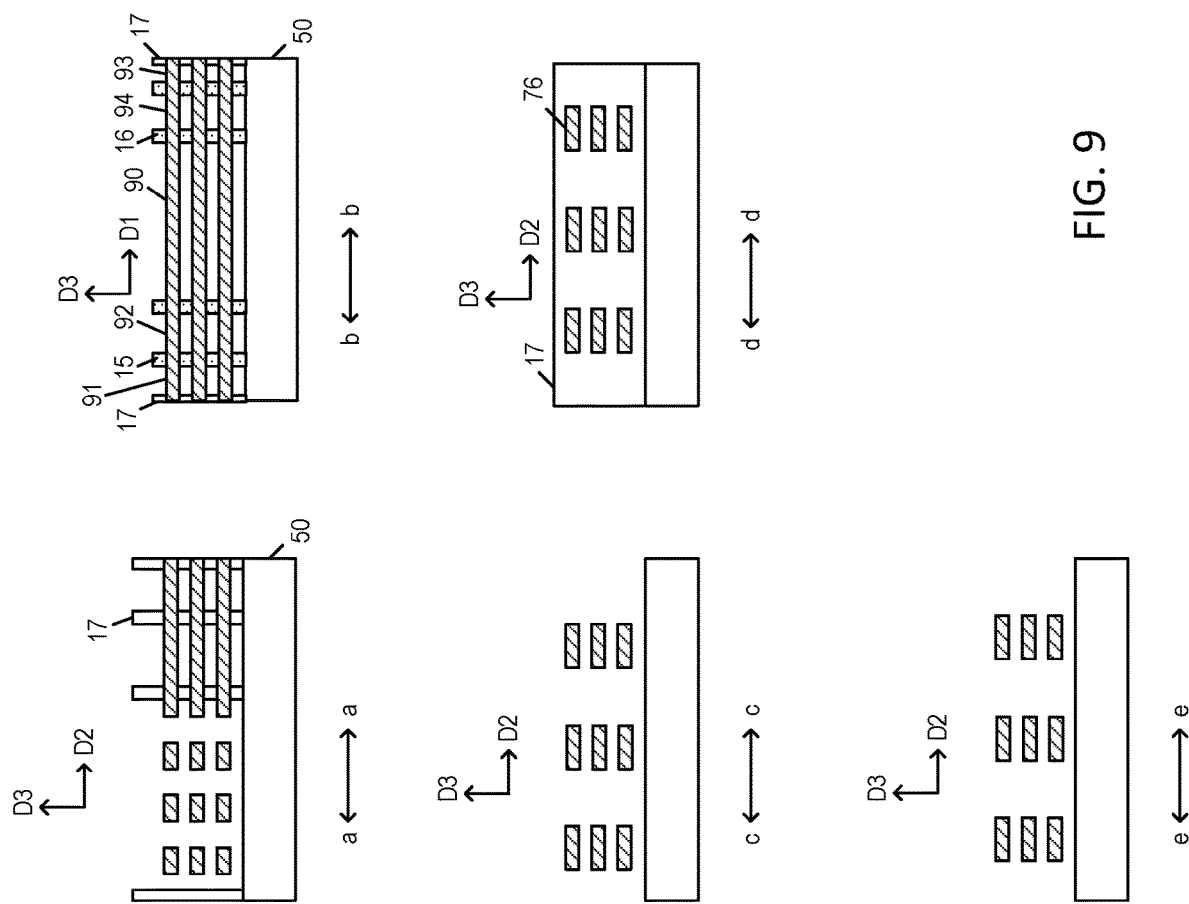

In some embodiments, the specific steps of forming transistors on the substrate 50 include:

forming semiconductor cylinders 76 on the substrate 50, as shown in FIG. 6;

forming an initial channel region 90, an initial source region 91 and an initial drain region 93 distributed on opposite sides of the initial channel region 90, and an initial source region 91 and the initial source region 93 are defined in the semiconductor cylinder 76, an initial first doped region 92 between the initial channel regions 90, and an initial second doped region 94 located between the initial drain region 93 and the initial channel region 90, as shown in FIG. 9;

Implanting first type dopant ions into the initial source region 91, the initial drain region 93, the initial first doped region 92 and the initial second doped region 94 to form the source region 11. The first doped region 13, the drain region 12 and the second doped region 14.

In some embodiments, an initial channel region 90, an initial source region 91 and an initial drain region 93 distributed on opposite sides of the initial channel region 90 are defined in the semiconductor cylinder 76, located in the initial source. The initial first doped region 92 between the source region 91 and the initial channel region 90 and the initial second doped region 94 between the initial drain region 93 and the initial channel region 90 Specific steps include:

an initial channel region 90 is defined in the semiconductor cylinder 76, initial source regions 91 and 93 distributed on opposite sides of the initial channel region 90 along the first direction D1, along the first direction D1 is located in the initial first doped region 92 between the initial source region 91 and the initial channel region 90, and is located between the initial drain region 93 and the initial channel along the first direction D1. The initial second doped region 94 between the regions 90, the length of the initial first doped region 92 along the first direction D1 is more than twice the thickness of the semiconductor cylinder 76 along the third direction D3, so the length of the initial second doped region 94 along the first direction D1 is more than twice the thickness of the semiconductor cylinder 76 along the third direction D3, and the first direction D1 is parallel to the top surface of the substrate 50, the third direction D3 is a direction perpendicular to the top surface of the substrate 50.

In some embodiments, the specific steps of forming the semiconductor cylinders 76 over the substrate 50 include:

forming a stacked layer on the substrate 50, and the stacked layer includes a semiconductor layer 52 and a sacrificial layer 51 alternately stacked along a third direction D3, the third direction D3 is perpendicular to the top surface of the substrate 50 direction;

etching the stacked layers to form first trenches 60 penetrating the stacked layers along the third direction D3. A plurality of the first trenches 60 are arranged at intervals along the second direction D2. The trench 60 separates the semiconductor layer 52 into a plurality of the semiconductor cylinders 76 spaced along the second direction D2, the semiconductor cylinders 76 extending along the first direction D1, the first direction D1 and the second directions D2 are all directions parallel to the top surface of the substrate 50, and the first direction D1 and the second direction D2 intersect.

Specifically, epitaxial growth can be used to alternately form the semiconductor layer 52 and the sacrificial layer 51 on the top surface of the substrate 50 along the third direction D3 to form all the superlattice stack structures. The stacked layers are shown in FIG. 5. The more the semiconductor layers 52 and the sacrificial layers 51 are alternately stacked, the greater the storage capacity of the formed semiconductor device. In one embodiment, the material of the semiconductor layer 52 may be Si, and the material of the sacrificial layer 51 may be SiGe. After that, a first dielectric layer 53 is formed on the top surface of the stacked layer, and the stacked layer and the first dielectric layer 53 are etched by a photolithography process to form a plurality of penetrating layers along the third direction D3. The first dielectric layer 53 and the first trench 60 of the stacked layer. The first trench 60 separates the semiconductor layer 52 into a plurality of the semiconductor cylinders 76 spaced along the second direction D2, and the semiconductor cylinders 76 extend along the first direction D1, as shown in FIG. 6.

Figure 7:
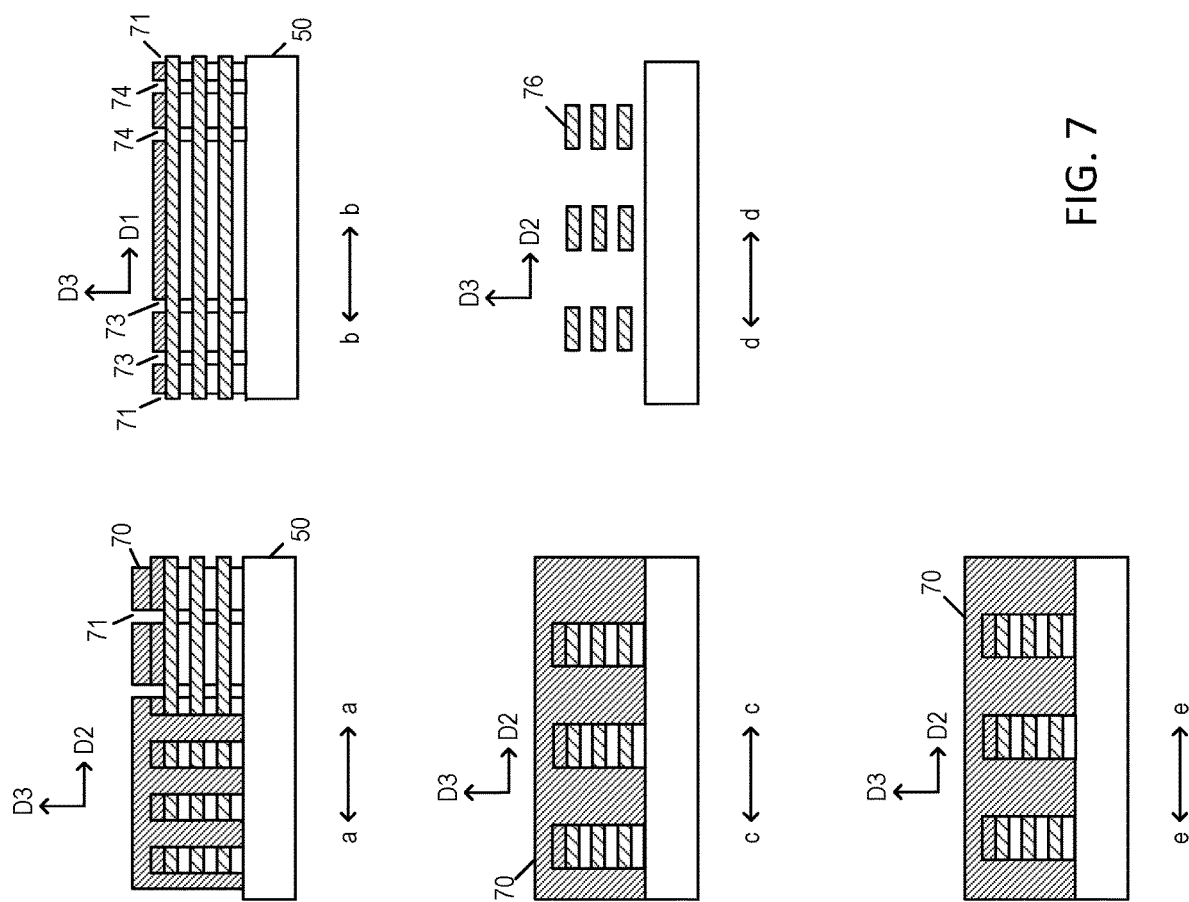
Figure 8:
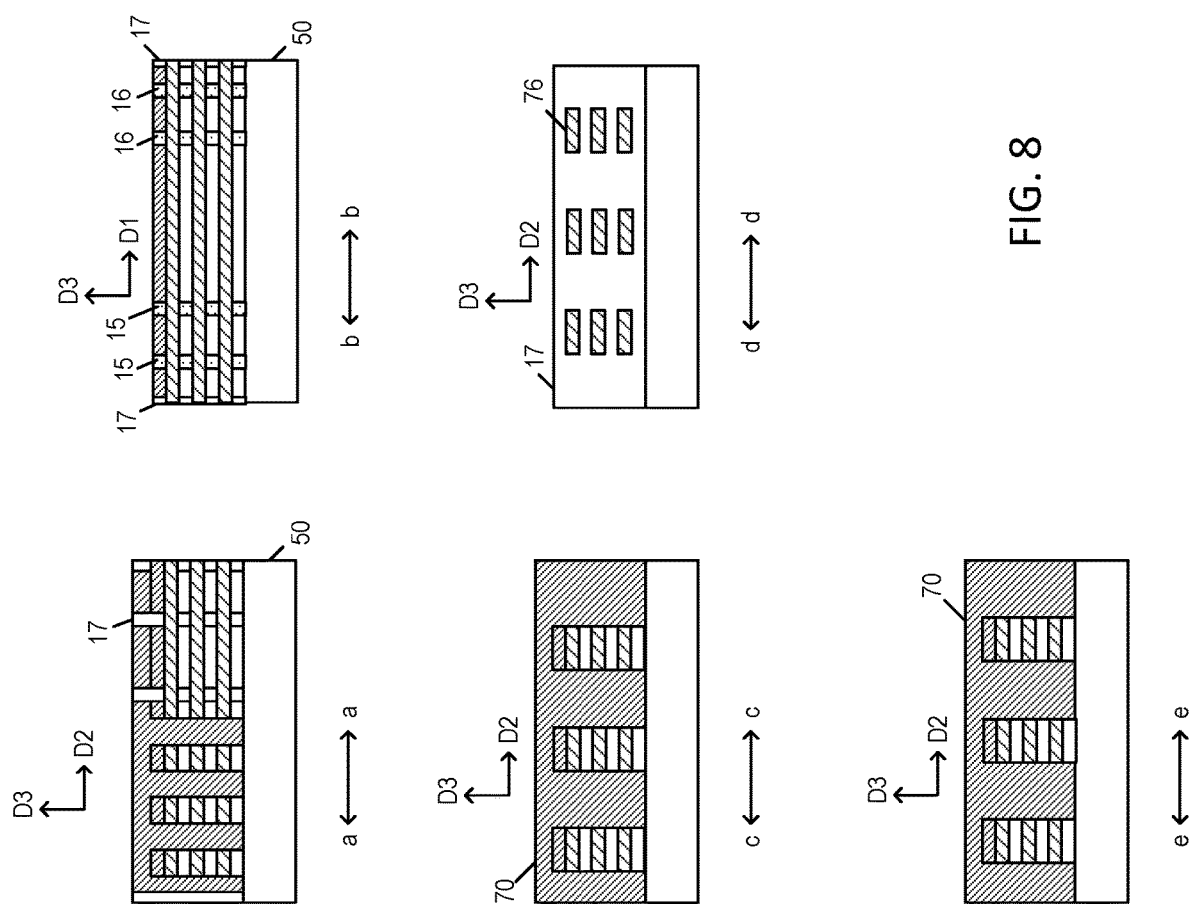

In some embodiments, first type dopant ions are implanted before the initial source region 91, the initial drain region 93, the initial first doped region 92 and the initial second doped region 94, also includes the following steps:

removing a part of the sacrificial layer 51 from the stacked layers to form a second trench 73 and a third trench 74, and the second trench 73 exposes the initial first doped region 92 and the initial channel. The semiconductor cylinders 76 between regions 90, and the semiconductor cylinders 76 between the initial first doped regions 92 and the initial source regions 91, the third trenches 74 expose the initial first semiconductor cylinder 76 between the second doped region 94 and the initial channel region 90, and the semiconductor cylinder 76 between the initial second doped region 94 and the initial drain region 93, such as shown in FIG. 7; and and depositing a first dielectric material on the second trench 73 and the third trench 74, forming the first isolation layer 15 in the second trench 73 and simultaneously forming the third trench 74. The second isolation layer 16 is shown in FIGS. 8 and 4.

Specifically, after the first trench 60 is formed, an insulating dielectric material such as oxide (eg, silicon dioxide) may be deposited in the first trench 60 to form the first trench 60 filled with A fill layer 70 covering the top surface of the stacked layers is shown in FIG. 7. After that, a photolithography process may be used to remove part of the sacrificial layer 51 to form the second trench 73, the third trench 74, and the support hole 71 exposing part of the semiconductor cylinder 76. The second trench 73 is annular, and the projection of the second trench 73 on the top surface of the substrate 50 surrounds a plurality of the initial first doped regions 92 on the substrate The perimeter distribution of the projection on the top surface of 50. The third trench 74 is also annular, and the projection of the third trench 74 on the top surface of the substrate 50 surrounds a plurality of the initial second doped regions 74 on the substrate 50 The peripheral distribution of the projection on the top surface of. At the same time, a first dielectric material such as nitride (e.g., silicon nitride) is filled in the second trench 73, the third trench 74 and the support hole 71, and the first isolation layer 15 is formed at the same time, the second isolation layer 16 and the support column 17, as described in FIG. 4 and FIG. 8.

Figure 10:
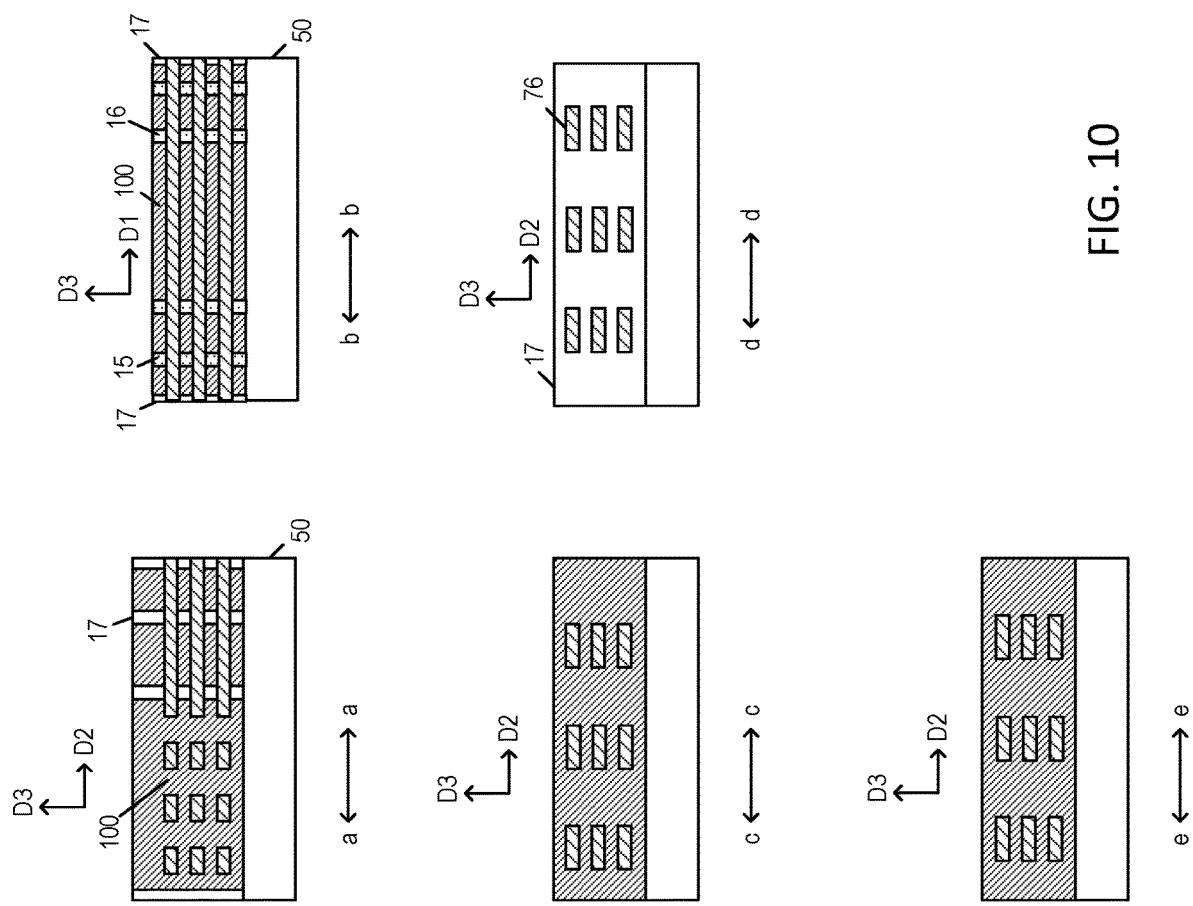

In some embodiments, first type dopant ions are implanted before the initial source region 91, the initial drain region 93, the initial first doped region 92 and the initial second doped region 94, also includes the following steps:
  removing the sacrificial layer 51 from the stacked layers to expose the fourth trench of the semiconductor cylinder 76, as shown in FIG. 9; and
  filled the second dielectric material in the fourth trench to form an interlayer isolation layer 100, as shown in FIG. 10.

Specifically, a wet etching process may be used to remove all the sacrificial layers 51 in the stacked layers, thereby forming fourth trenches exposing the semiconductor cylinders 76. After that, a second dielectric material such as oxide (e.g., silicon dioxide) is deposited in the fourth trench to form the interlayer isolation layer 100, as shown in FIG. 10.

In some embodiments, first type dopant ions are implanted into the initial source region 91, the initial drain region 93, the initial first doped region 92 and the initial second doped region 94. Specific steps include:
  implanting first type dopant ions into the initial source region 91 and the initial drain region 93 to form the source region 11 and the drain region 12;
  implanting the first type of doping ions into the initial first doped region 92 and the initial second doped region 94 to form the first doped region 13 and the second doped region 14.

In some embodiments, the method of forming the semiconductor device further comprises:
  implanting first type dopant ions into the initial channel region 90 to form the channel region 10; or,
  implanting the second type of dopant ions into the initial channel region 90 to form the channel region 10, and the first type of dopant ions and the second type of dopant ions have opposite conductivity types.

Specifically, multiple photomasks and multiple doping processes may be used to provide the initial source region 91, the initial drain region 93, the initial first doped region 92 and the initial second doped region 91. The doped region 94 and the initial channel region 90 are implanted with doping ions respectively, and the doping of different types and/or different concentrations has been completed in each region. Wherein, the first type of doping ions are implanted into the initial source region 91, the initial drain region 93, the initial first doped region 92 and the initial second doped region 94, and the specific method for doping the first type dopant ions or the second type dopant ions in the initial channel region 90 may be vapor diffusion, plasma doping or ion implantation.

In some embodiments, after forming the source region 11, the first doped region 13, the drain region 12 and the second doped region 14, the following steps are further included:
  removing the interlayer isolation layer 100 between the adjacent first doped regions 13 and removing the interlayer isolation layer 100 between the adjacent second doped regions 14 simultaneously, to form the first air gap between the adjacent first doped regions 13 and the second air gap between the adjacent second doped regions 14 simultaneously.

Specifically, the first air gap is formed between the first doped regions 13 surrounded by the first isolation layer 15, so that the low dielectric constant of air is used to reduce the adjacent first doped regions Interference between zones 13. Correspondingly, the second air gap is formed between the second doped regions 14 surrounded by the second isolation layer 16, so that the low dielectric constant of air is used to reduce the adjacent second doped regions 14 interference between.

In some embodiments, after forming first air gap between adjacent first doped regions 13 and forming second air gap between adjacent second doped regions 14 at the same time, further includes the following step:
  depositing the first dielectric material in the first air gap and the second air gap.

Specifically, the first dielectric material continuously covers a plurality of the first doped regions 13 arranged in an array, and fills the gaps between the adjacent first doped regions 13. Two dielectric materials continuously cover the plurality of second doped regions 14 arranged in an array, and fill the gaps between adjacent second doped regions 14, thereby further reducing the band-to-band tunneling effect.

After forming the source region 11, the first doped region 13, the drain region 12 and the second doped region 14, a capacitor 22 is electrically connected to the drain region 12, thus a capacitor 22 is formed. The source region 11 is electrically connected to the bit line 19, the word line 18 covering the channel region 10, the bit line plug 21 located on the top surface of the bit line 19, and the top surface of the word line 18. word line plugs 20 to obtain the structure shown in FIG. 4. A plurality of the word lines 18 are arranged at intervals along the third direction, and each of the word lines 18 continuously covers or wraps a plurality of the channel regions 10 arranged at intervals along the second direction D2. The ends of the plurality of word lines 18 together form a stepped structure, so that the word lines 18 and the peripheral control circuit are electrically connected through the word line plugs 20.

Some embodiments of the present invention provide a semiconductor device and a method for forming the same, by arranging a first doped region between a channel region and a source region, and arranging a second doped region between the channel region and the drain region The ion doping type of the first doped region is the same as that of the source region, the ion doping type of the second doped region is the same as that of the drain region, and the doped concentration of the first doped region is lower than that of the source region and the second doped region. The doped concentration of the second doped region is lower than that of the drain region, so as to reduce the band-band tunneling effect inside the transistor, thereby reducing the GIDL effect. Furthermore, some embodiments of the present disclosure form a first isolation layer surrounding the first doped region and a second isolation layer surrounding the second doped region. On the one hand, the first doped region and the second doped region affects other components in the semiconductor device; on the other hand, it also helps to further reduce the band-band tunneling effect inside the transistor, thereby further reducing the GIDL effect.

The above are only the preferred embodiments of the present disclosure. It should be pointed out that for those skilled in the art, without departing from the principles of the present disclosure, several improvements and modifications can also be made, and these improvements and modifications should also be regarded as Scope of protection of this disclosure.

The invention claimed is:

1. A semiconductor device comprising:
a substrate;
a plurality of transistors located on the substrate, wherein the plurality of transistors each comprises an active cylinder, wherein the active cylinder comprises a channel region, a source region and a drain region disposed on opposite sides of the channel region, a first doped region disposed between the source region and the channel regions, and a second doped region disposed between the drain region and the channel region;
wherein the first doped region, the source region, the second doped region and the drain region comprise doping ions of a first type, and
wherein a doped concentration of the first doped region is lower than a doped concentration of the source region, and a doped concentration of the second doped region is lower than a doped concentration of the drain region; and
wherein each of the active cylinders extends along a first direction, wherein the active cylinders are arranged in an array along a second direction and a third direction, wherein the first direction and the second direction are both parallel to a top surface of the substrate, wherein the first direction intersects the second direction, and wherein the third direction is perpendicular to the top surface of the substrate direction;
wherein the semiconductor device further comprises:
a plurality of word lines extending along the second direction, wherein the plurality of word lines continuously covers the channel regions in the active cylinders spaced at intervals along the second direction; and
wherein the plurality of word lines are arranged at the intervals along the third direction, and wherein among two adjacent ones of the plurality of word lines along the third direction, one of the two adjacent word lines closer to the substrate protrudes from the other of the two word lines along the third direction.

2. The semiconductor device of claim 1, wherein each of the active cylinders extends in a first direction, wherein the first direction is parallel to a top surface of the substrate;
wherein the semiconductor device further comprises:
a first isolation layer, located on the substrate, wherein the first isolation layer is disposed around an outer periphery of the first doped region, and wherein the active cylinder penetrates the first isolation layer along the first direction; and
a second isolation layer, located on the substrate, wherein the second isolation layer is disposed around an outer periphery of the second doped region, and wherein the active cylinder penetrates the second isolation layer along the first direction.

3. The semiconductor device of claim 2, wherein the active cylinders of the plurality of transistors are spaced apart along a second direction, wherein the second direction is parallel to the top surface of the substrate, and wherein the first direction intersects the second direction;
wherein the first isolation layer surrounds continuously the outer periphery of the first doped regions of the plurality of transistors arranged at intervals along the second direction; and
wherein the second isolation layer surrounds continuously the outer periphery of the second doped regions of the plurality of transistors arranged at the intervals along the second direction.

4. The semiconductor device according to claim 3, further comprising:
a first air gap, located between adjacent first doped regions; and
a second air gap, located between adjacent second doped regions.

5. The semiconductor device of claim 1, wherein the active cylinders of the plurality of transistors extend in the first direction, wherein the first direction is parallel to a top surface of the substrate;
wherein the semiconductor device further comprises:
a first isolation layer disposed on the substrate, wherein the first isolation layer covers the first doped region, wherein the active cylinders each penetrates the first isolation layer along the first direction; and
a second isolation layer, disposed on the substrate, wherein the second isolation layer covers the second doped region, wherein the active cylinders each penetrates the second isolation layer along the first direction.

6. The semiconductor device of claim 5, wherein the active cylinders are spaced at intervals along a second direction, wherein the second direction is parallel to the top surface of the substrate, and wherein the first direction intersects the second direction;
wherein the first isolation layer continuously covers each of the first doped regions spaced at the intervals along the second direction; and
wherein the second isolation layer continuously covers each of the second doped regions spaced at the intervals along the second direction.

7. The semiconductor device of claim 1, wherein the channel region comprises doping ions of a first type; or,
wherein the channel region comprises doping ions of a second type, wherein the doping ions of the first type and the doping ions of the second type have opposite conductivity.

8. The semiconductor device of claim 1, wherein each of the active cylinders extends in a first direction, wherein the first direction is parallel to a top surface of the substrate;
wherein a length of the first doped region along the first direction is more than twice a thickness of each of the active cylinders along a third direction, wherein the third direction is perpendicular to the top surface of the substrate; and
wherein a length of the second doped region along the first direction is more than twice a thickness of each of the active cylinders along the third direction.

9. The semiconductor device of claim 1, wherein each of the active cylinders extends in a first direction, wherein the first direction is parallel to a top surface of the substrate;
wherein a length of the first doped region along the first direction is greater than or equal to a length of the source region along the first direction; and
wherein a length of the second doped region along the first direction is greater than or equal to a length of the drain region along the first direction.

10. A method for forming a semiconductor device, comprising steps of:
  providing a substrate;
  forming a plurality of transistors on the substrate, wherein the plurality of transistors each comprises an active cylinder, wherein the active cylinder comprises a channel region, a source region and a drain region disposed on opposite sides of the channel region, a first doped region disposed between the source region and the channel region, and a second doped region disposed between the drain region and the channel region, wherein the first doped region, the source region, the second doped region, and the drain region all comprise doping ions of a first type, wherein a doped concentration of the first doped region is lower than a doped concentration of the source region, and wherein a doped concentration of the second doped region is lower than a doped concentration of the drain region; and
  wherein each of the active cylinders extends along a first direction, wherein the active cylinders are arranged in an array along a second direction and a third direction, wherein the first direction and the second direction are both parallel to a top surface of the substrate, wherein the first direction intersects the second direction, and wherein the third direction is perpendicular to the top surface of the substrate direction;
  wherein the semiconductor device further comprises:
  a plurality of word lines extending along the second direction, wherein the plurality of word lines continuously covers the channel regions in the active cylinders spaced at intervals along the second direction;
  and wherein the plurality of word lines are arranged at the intervals along the third direction, and wherein among two adjacent ones of the plurality of word lines along the third direction, one of the two adjacent word lines closer to the substrate protrudes from the other of the two word lines along the third direction.

11. The method for forming the semiconductor device according to claim 10, wherein the step of forming the plurality of transistors on the substrate comprises:
  forming a semiconductor cylinder over the substrate;
  defining an initial channel region, an initial source region and an initial drain region disposed on opposite sides of the initial channel region, an initial first doped region between the initial source region and the initial channel region, and an initial second doped region between the initial drain region and the initial channel region; and
  implanting first type doping ions into the initial source region, the initial drain region, the initial first doped region and the initial second doped region to form the source region, the drain region, the first doped region, and the second doped region.

12. The method for forming the semiconductor device according to claim 11, wherein the step of defining the initial channel region, the initial source region and the initial drain region disposed on the opposite sides of the initial channel region in the semiconductor cylinder, and the initial first doped region located between the initial source region and the initial channel region, and the initial second doped region located between the initial drain region and the initial channel region, comprises steps of:
  defining the initial channel region in the semiconductor cylinder, disposing the initial source region and the initial drain region on opposite sides of the initial channel region along the first direction;
  defining the initial first doped region between the initial channel region and the initial source region along the first direction; and
  defining the initial second doped region between the initial drain region and the initial channel region along the first direction, wherein a length of the initial first doped region along the first direction is more than twice a thickness of the semiconductor cylinder along a third direction, wherein a length of the initial second doped region along the first direction is more than twice a thickness of the semiconductor cylinder in the third direction, and wherein the first direction is parallel to a top surface of the substrate, and wherein the third direction is perpendicular to the top surface of the substrate.

13. The method for forming the semiconductor device according to claim 11, wherein the step of forming the semiconductor cylinder on the substrate comprises:
  forming a stacked layer on the substrate, wherein the stacked layer comprises a semiconductor layer and a sacrificial layer alternately stacked along a third direction, wherein the third direction is perpendicular to the top surface of the substrate;
  etching the stacked layer to form a plurality of first trenches penetrating the stacked layer along the third direction, wherein the plurality of first trenches separates the semiconductor layer into a plurality of the semiconductor cylinders spaced at intervals along a second direction, wherein the plurality of the semiconductor cylinders extend along the first direction, wherein both the first direction and the second direction are parallel to the top surface of the substrate, and wherein the first direction intersects the second direction.

14. The method for forming the semiconductor device according to claim 13, wherein before the first type doing ions are implanted into the initial source region, the initial drain region, the initial first doped region and the initial second doped region, the method further comprises following steps:
  removing a part of the sacrificial layer in the stacked layer to form second trenches and third trenches, wherein the second trenches expose the semiconductor cylinder between the initial first doped region and the initial channel region and the semiconductor cylinder between the initial first doped region and the initial source region;
  wherein the third trenches expose the semiconductor cylinder between the initial second doped region and the initial channel region and the semiconductor cylinder between the initial second doped region and the initial drain region; and
  deposited a first dielectric material in the second trenches and in the third trenches;
  forming a first isolation layer in the second trenches; and
  forming a second isolation layer in the third trenches simultaneously.

15. The method of forming the semiconductor device according to claim 14, wherein before implanting the first type doping ions into the initial source region, the initial drain region, the initial first doped region, and the initial second doped region, the method further comprises:
  removing the sacrificial layer from the stacked layer to expose fourth trenches of the semiconductor cylinder; and
  filling a second dielectric material into the fourth trenches to form an interlayer isolation layer.

16. The method of forming the semiconductor device according to claim 15, wherein implanting the first type doping ions into the initial source region, the initial drain region, the initial first doped region and the initial second doped region comprise steps of:
- implanting the first type doping ions into the initial source region and the initial drain region to form the source region and the drain region; and
- implanting the first type doping ions into the initial first doped region and the initial second doped region to form the first doped region and the second doped region.

17. The method for forming the semiconductor device according to claim 16, wherein after forming the source region, the first doped region, the drain region and the second doped region, the method further comprises following steps:
- removing the interlayer isolation layer between adjacent first doped regions and simultaneously removing the interlayer isolation layer between adjacent second doped regions to form a first air gap between the first doped regions and a second air gap between adjacent second doped regions simultaneously.

18. The method for forming the semiconductor device according to claim 17, wherein after forming the first air gap between adjacent first doped regions and the second air gap between adjacent second doped regions simultaneously, the method further comprises a step of:
- depositing a first dielectric material in the first air gap and the second air gap.

19. The method for forming the semiconductor device according to claim 11, further comprising:
- implanting the first type doping ions into the initial channel region to form the channel region; or,
- implanting the second type doping ions into the initial channel region to form the channel region, wherein the first type doping ions and the second type doping ions have opposite conductivity.

* * * * *